US008493119B2

(12) United States Patent
Leach et al.

(10) Patent No.: US 8,493,119 B2
(45) Date of Patent: Jul. 23, 2013

(54) SCANNABLE FLIP-FLOP WITH HOLD TIME IMPROVEMENTS

(75) Inventors: Derrick A. Leach, Austin, TX (US);
Thomas J. Best, Austin, TX (US);
Edward M. McCombs, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/295,992

(22) Filed: Nov. 14, 2011

(65) Prior Publication Data

US 2012/0146697 A1 Jun. 14, 2012

Related U.S. Application Data

(60) Provisional application No. 61/422,605, filed on Dec. 13, 2010.

(51) Int. Cl.
*H03K 3/289* (2006.01)
(52) U.S. Cl.
USPC .......................................................... 327/202
(58) Field of Classification Search
USPC ................. 327/199–203, 207, 210–212, 214, 327/215, 218, 99, 407–413
See application file for complete search history.

(56) References Cited

U.S. PATENT DOCUMENTS

| 7,345,519 B2 | 3/2008 | Hirata |
| 7,543,205 B2 | 6/2009 | Abhishek |
| 7,560,965 B2 | 7/2009 | Waldrip et al. |
| 7,649,395 B2 | 1/2010 | Ahmadi |
| 7,994,823 B2 | 8/2011 | Lee et al. |
| 8,000,165 B2 * | 8/2011 | Jung et al. .................. 365/233.1 |
| 2005/0235184 A1 * | 10/2005 | Yamauchi ..................... 714/726 |
| 2005/0280459 A1 * | 12/2005 | Inoue ............................ 327/203 |

* cited by examiner

Primary Examiner — Lincoln Donovan
Assistant Examiner — Sibin Chen
(74) Attorney, Agent, or Firm — Anthony M. Petro; Meyertons, Hood, Kivlin, Kowert & Goetzel, P.C.

(57) ABSTRACT

Embodiments of a scannable flip-flop are disclosed that may reduce data hold time, which may in turn improve the performance of circuits incorporating the scannable flip-flop. The scannable flip-flop may include a slave latch and a master latch including an input multiplexer. The multiplexer may include a number of input ports, for example to receive normal operating mode data as well as scan operating mode data, and the multiplexer may be operable to controllably select one of the input ports and pass the value of the selected port to an output of the multiplexer. For example, the multiplexer may generate individual control signals for the various ports dependent upon both the clock signal and a select signal, such that each of the ports is qualified with the select signal and the clock signal before the multiplexer presents the input data of the selected port as the output of the multiplexer.

19 Claims, 9 Drawing Sheets

SCANNABLE FLIP-FLOP WITH HOLD TIME IMPROVEMENTS

PRIORITY CLAIM

This application claims benefit of priority of U.S. Provisional Patent Appl. No. 61/422,605, filed Dec. 13, 2010, which is incorporated by reference herein in its entirety.

BACKGROUND

1. Technical Field

This invention is related to the field of integrated circuit implementation, and more particularly to techniques for implementing scannable storage elements.

2. Description of the Related Art

Processors, and other types of integrated circuits, typically include a number of logic circuits composed of interconnected transistors fabricated on a semiconductor substrate. Such logic circuits may be constructed according to a number of different circuit design styles. For example, combinatorial logic may be implemented via a collection of unclocked static complementary metal-oxide semiconductor (CMOS) gates situated between clocked state devices such as flip-flops or latches. Alternatively, depending on design requirements, some combinatorial functions may be implemented via clocked dynamic gates, such as domino logic gates.

For testability, integrated circuits often include scan functionality through which test patterns can be inserted into a circuit and test results can be read out. Scan-based testing may enable a greater degree of test coverage of a given design than functional testing, in that scan-based testing may facilitate direct access to logic that might otherwise require hundreds or thousands of execution cycles to be evaluated through normal integrated circuit operation. In some cases, scan-based testing may allow testing of circuit elements that might be impractical or even impossible to test through functional testing.

However, implementing scan functionality into a circuit typically requires implementing some capability for selecting between normal operating mode data and scan data at the input of at least some gates, in order to provide a path via which scan data may be inserted into a circuit during testing. The additional circuitry needed to implement such a selection may create a performance penalty during normal mode circuit operation.

SUMMARY

Various embodiments of a scannable flip-flop are disclosed that may reduce data hold time, which may in turn improve the performance of circuits incorporating the scannable flip-flop. In an embodiment, the scannable flip-flop may include an input multiplexer, a master latch, and a slave latch. The multiplexer may include a number of input ports, such as a port coupled to receive normal operating mode data and a port coupled to scan operating mode data, and the multiplexer may be operable to controllably select one of the input ports and pass the value of the selected port to an output of the multiplexer. In some embodiments, each port of the multiplexer may correspond to a controllable inverter having a data input and a control input, where the inverter is activated to pass the inverse of its data input when the control input is selected.

The master latch and slave latch may each include a state element that is operable to persistently and controllably store a data value. For example, each of the latches may include a feedback loop that includes two or more inverters connected in series, where one of the inverters is enabled dependent upon the state of a clock signal. In some embodiments, the output of the multiplexer may be coupled to the storage element of the master latch, and the output of the master latch may be coupled to the storage element of the slave latch via a pass gate. In some embodiments, a clocked (i.e., controllable) inverter may be employed instead of a pass gate.

During operation, to select a particular one of the ports, the multiplexer may generate individual control signals for the various ports dependent upon both the clock signal and a select signal, such that each of the ports is qualified with the select signal and the clock signal before the multiplexer presents the input data of the selected port as the output of the multiplexer. The selected data may then be loaded into the master and slave latches under control of the clock signal.

BRIEF DESCRIPTION OF THE DRAWINGS

The following detailed description makes reference to the accompanying drawings, which are now briefly described.

Figure 1:
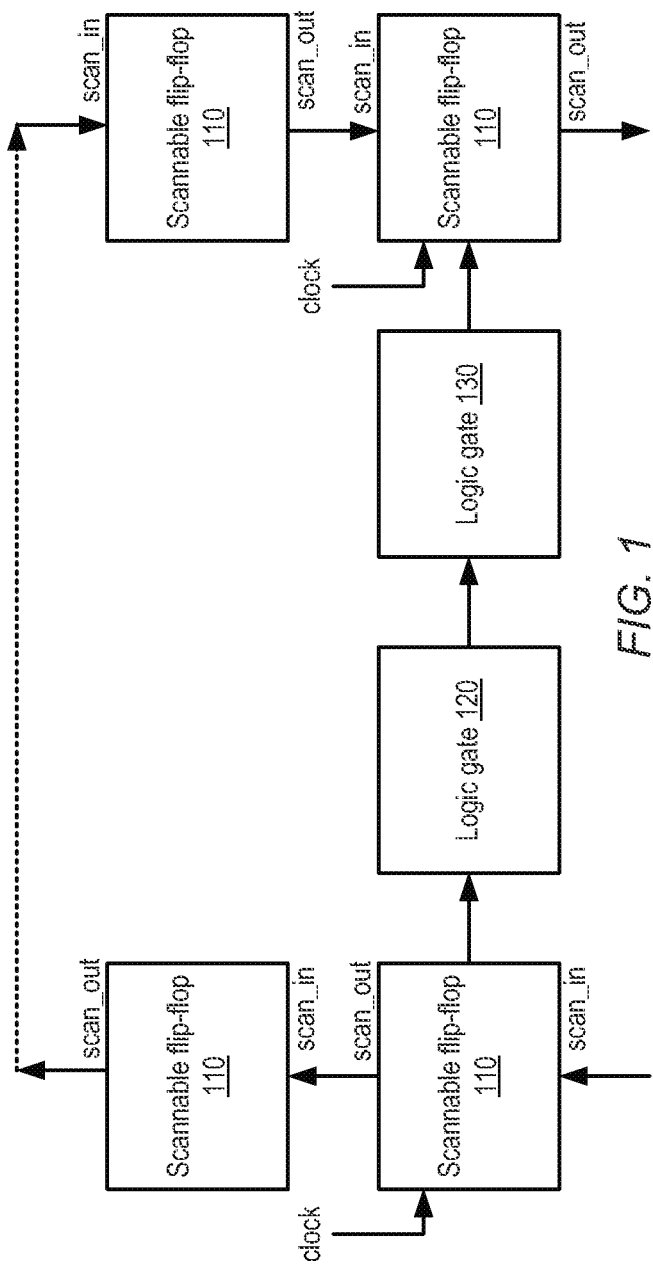
FIG. 1 illustrates an example of a portion of a scannable logic path.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks, in such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C.

§112, paragraph six interpretation for that unit/circuit/component. More generally, the recitation of any element is expressly intended not to invoke 35 U.S.C. §112, paragraph six interpretation for that element unless the language "means for" or "step for" is specifically recited.

DETAILED DESCRIPTION OF EMBODIMENTS

FIG. 1 illustrates an example of a portion of a scannable logic path. In the illustrated embodiment, scannable flip-flop 110 is coupled to a logic gate 120, which is in turn coupled to a logic gate 130. Logic gate 130 is coupled to another scannable flip-flop 110. Generally speaking, scannable flip-flop 110 may correspond to any suitable scannable state element, such as a static or dynamic flip-flop. Scannable flip-flop 110 may operate to capture and store input data in response to a clock signal. For example, scannable flip-flop 110 may be an edge-triggered state element.

Logic gates 120 and 130 may be configured to implement combinatorial logic functions of any suitable type (e.g., AND, OR, NAND, NOR, XOR, XNOR, or any suitable Boolean expression). Either of logic gates 120 or 130 may be implemented using static or dynamic logic. For example, if implemented using dynamic logic, gates 120 or 130 may also be clocked by a clock signal (not shown) that may be the same as or different from the clock used to clock flip-flops 110. It is noted that the number of logic gates and the connectivity shown in FIG. 1 are merely an illustrative example, and that in other embodiments, other numbers and configurations of gates and state elements may be employed.

Each of scannable flip-flops 110 may include both a scan data output and a scan data input. As shown in FIG. 1, the scan data output of one scannable flip-flop 110 may be coupled to the scan data input of a different scannable flip-flop 110 to form a scan chain. The scan chain may be used during a test mode of operation to read and/or write the state of scannable flip-flops 110. In various embodiments, multiple independent scan chains may be employed, depending on design and testability constraints. As a non-limiting example, the scannable flip-flops 110 shown in FIG. 1 may be configured as a single scan chain interconnecting all four state elements, or as two independent scan chains each interconnecting two state elements. Other configurations are also possible.

The scannable logic path illustrated in FIG. 1 may correspond to any of numerous different types of digital logic circuits, and may generally include any series of gates bounded by scannable state elements. For example, it may correspond to a portion of a datapath within a microprocessor, such as a portion of an adder, shifter, multiplier, divider, buffer, register file, or any other type of circuit or functional unit that operates to store or operate on data during the course of instruction execution. The scannable logic path may also correspond to microprocessor control paths that compute signals that control the operation of datapath or other elements within a microprocessor. However, it is noted that other configurations of scannable logic paths are possible and contemplated.

Figure 2:
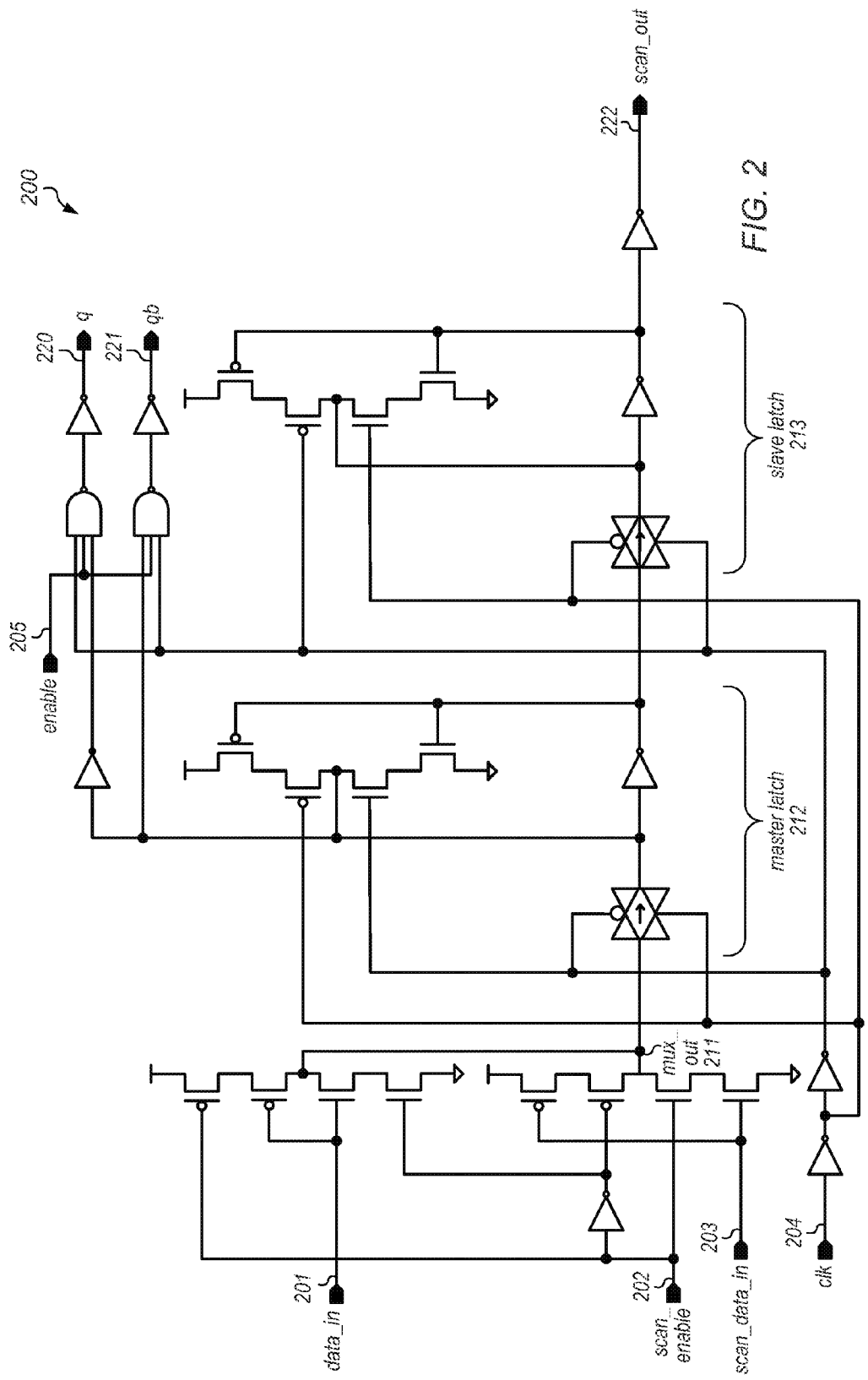
FIG. 2 illustrates an embodiment of a scannable flip-flop.

FIG. 2 illustrates a scannable flip-flop according to one of several possible embodiments. In the illustrated embodiment, flip-flop 200 includes a data input 201 and a scan data input 203, respectively denoted "data_in" and "scan_data_in," as well as a multiplexer select input 202 denoted "scan_enable" and an output enable signal 205 denoted "enable." Flip-flop 200 further includes a clock input 204 denoted "clk." Flip-flop 200 also includes true and complement data outputs 220 and 221 respectively denoted "q" and "qb," as well as a scan data output 222 denoted "scan_out."

In the illustrated embodiment, flip-flop 200 includes a 2:1 multiplexer that controllably selects either the port data_in 201 or the port scan_data_in 203 dependent upon the state of the select signal scan_enable 202. Each input port of the multiplexer may be implemented by at least two P-type devices and at least two N-type devices arranged in series (also referred to as a "stack") to form an inverter having a data input and a control input, where the inverter is enabled to pass the inverse of the data input when the control input is asserted. (An inverter having such a control input may also be referred to herein as a "clocked inverter" or a "controllable inverter," although it is noted that the signal that drives the control input need not necessarily be a clock signal, but may be any type of control signal.) Scan_enable 202 may be indicative of a scan mode of operation, such as when the circuit that includes flip-flop 200 is undergoing post-manufacturing scan testing.

For example, in flip-flop 200, the top stack of the multiplexer corresponds to an inverter having a data input coupled to data_in 201, and the bottom stack corresponds to an inverter having a data input coupled to scan_data_in 203. Both clocked inverters have a control input coupled to scan_enable 202 or its inverse, with the two inverters being controlled by opposite sense of scan_enable 202. In response to scan_enable 202 being driven high, the bottom stack of the multiplexer may be enabled while the top stack may be disabled, causing the inverse of the scan_data_in input 203 to be driven to the mux_out node 211. In response to scan_enable 202 being driven low, the top stack of the multiplexer may be enabled while the bottom stack may be disabled, causing the inverse of the data_in input 201 to be driven to the mux_out node 211. In other embodiments, the sense of scan_enable 202 may be reversed (e.g., causing data_in 201 to be selected when high and scan_data_in 203 to be selected when low).

The output of the multiplexer, mux_out 211, is coupled to a master pass-gate latch 212, which is in turn coupled to a slave pass-gate latch 213. In the illustrated embodiment, master latch 212 includes a pass gate at the latch's data input, a master inverter coupled to the pass gate, and a master feedback inverter coupled to the master inverter to form a master feedback loop. Similarly, slave latch 213 includes an input pass gate, a slave inverter coupled to the pass gate, and a slave feedback inverter coupled to the slave inverter to form a slave feedback loop. Each of the feedback inverters has a corresponding control input that controls whether the feedback inverter is enabled or disabled. The feedback loop formed by each pair of inverters may be an example of a storage element, in that when the feedback inverter is enabled, the feedback loop preserves (and thus stores) the state that was input to the latch. (It is noted that the illustrated feedback loop is only one of many possible embodiments of a storage element that might be employed. In alternative embodiments, various types of clocked or non-clocked keeper circuits, dynamic or static RAM cells, non-clocked feedback circuits, or other suitable storage circuits might be used in place of the illustrated feedback loop.)

In the illustrated embodiment, when the clock input 204 is low, the pass gate of master latch 212 is open while the feedback inverter of master latch 212 is disabled, allowing the output node 211 of the multiplexer to be read into master latch 212. When the clock input 204 is high, the pass gate of master latch 212 closes and the feedback inverter is enabled, allowing the previously captured data to be stored without being affected by further transitions on multiplexer output node 211. Slave latch 213 provides similar functionality, but operates in response to the opposite clock phase relative to master latch 212, such that in the illustrated embodiment, only one of master latch 212 or slave latch 213 is open when clock 204 is either high or low. In some embodiments, a different clock phase than that shown may be used to control the master and slave latches. For example, master latch 212 may be open when the clock input is high and closed when it is low.

Collectively, the master and slave latches 212-213 may implement a master-slave flip-flop, the output of which drives the scan_out output 222 of flip-flop 200. In some embodiments, scan_out output 222 may be coupled to the scan_data_in input of another instance of a scannable flip-flop (either another instance of flip-flop 200, or some other configuration) to form a scan chain. Also, in some embodiments, instead of being unused when not in scan mode operation, scan_out output 222 may also be used to drive functional mode data during a functional mode of operation.

In the illustrated embodiment, the pass gate of master latch 212 also drives additional gates that generate the true and complement q and qb outputs 220 and 221. In particular, in the illustrated configuration, the output data is qualified with both clock 204 and enable 205, such that when clock 204 is high (and thus master latch 212 is closed) and enable 205 is high, the value stored in master latch 212 is presented in true and complement form via the q and qb outputs 220 and 221. Once clock 204 transitions low, or in response to enable 205 being tow at any time, both the q and qb outputs 220 and 221 will be low. Thus, the q and qb outputs 220 and 221 may be referred to as being encoded in a return-to-zero (RTZ) format, such that one of q 220 or qb 221 may be high when the clock is high, but the low-going transition of the clock resets both q 220 and qb 221 to low. (In other embodiments, q 220 and qb 221 may be implemented as static outputs, or as RTZ outputs controlled by the opposite phase of clock 204, such that a high-going transition of clock 204 causes the outputs to reset.)

Figure 3:
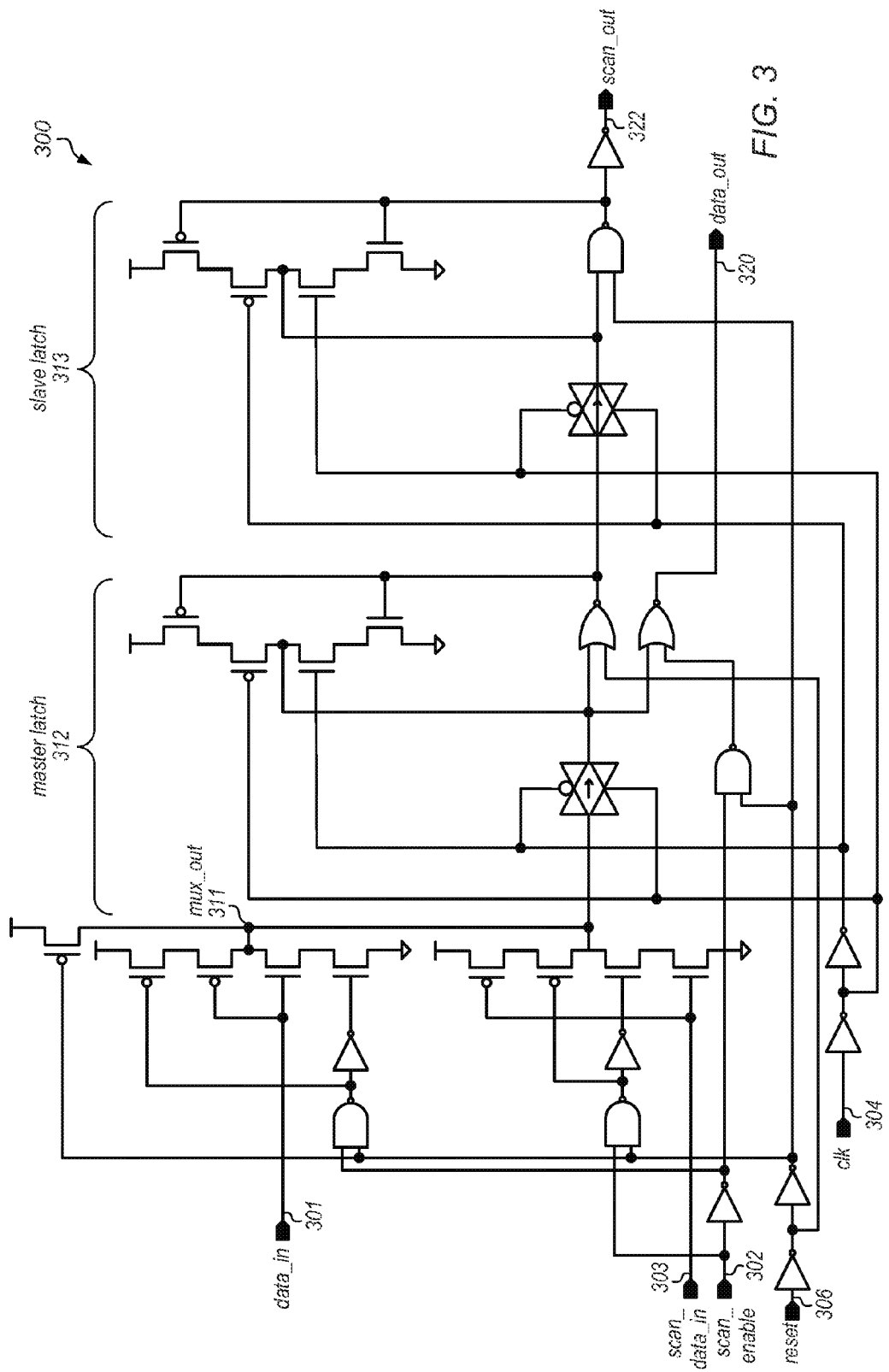
FIG. 3 illustrates an embodiment of a scannable flip-flop that provides reset functionality.

FIG. 3 illustrates a variant of the scannable flip-flop of FIG. 2 that provides reset functionality. In the illustrated embodiment, flip-flop 300 includes a number of inputs and outputs that are similar to flip-flop 200: a data input 301 and a scan data input 303, respectively denoted "data_in" and "scan_data_in," as well as a multiplexer select input 302 denoted "scan_enable" and a clock input 304 denote "clk." In contrast to flip-flop 200, flip-flop 300 includes a reset input 306 denoted "reset" as well as a single-ended data output 320 denoted "data_out" in addition to its scan data output 322 denoted "scan_out." In the illustrated embodiment, data output 320 is static rather than encoded in RTZ format, although in alternative embodiments, data output 320 of flip-flop 300 could be implemented in an RTZ fashion in a manner similar to that described above with respect to outputs q 220 and qb 221 of flip-flop 200.

As shown in FIG. 3, flip-flop 300 includes a 2:1 input multiplexer having an output node 311 denoted "mux_out," as well as master and slave pass-gate latches 312 and 313. The multiplexer and latches 312 and 313 may generally operate in a manner similar to the similar elements described above with respect to flip-flop 200. However, flip-flop 300 includes additional logic that supports reset functionality. In the illustrated embodiment, reset input 306 may be an active-low signal that indicates that a reset should occur when the signal is at a low logic level. When reset 306 is high, the operation of flip-flop 300 may generally be similar to that of flip-flop 200 in terms of the progression of data from the inputs to the outputs. When reset 306 is low, both the upper and lower transistor stacks of the 2:1 multiplexer may be disabled, whereas the pullup P-type device coupled to the mux_out node 311 may be enabled, causing the mux_out node to be driven high. The low value of reset causes the value stored in master latch 312 and the output data_out 320 each to be driven low via the illustrated NOR gates. The low value of reset 306 also causes the value stored in slave latch 313 to be driven low via the illustrated NAND gate. It is noted that in alternative embodiments, with suitable substitutions for the illustrated NAND and NOR gates, reset 306 may instead be implemented as an active-high signal that causes reset to occur when in a high state. Also, while the illustrated embodiment may implement asynchronous reset assertion and synchronous reset deassertion, other embodiments having different timing configurations are possible.

In both flip-flops 200 and 300, the latching of input data occurs after the multiplexer function. That is, the input data generally must be held without changing until it propagates through the multiplexer and is latched within the master latch. Depending on the criticality of the input data, the hold time requirements of flip-flops 200 and 300 may complicate timing in the cone of logic that generates the input data. That is, the longer the input data must be held before the master pass gate closes and the input data may freely change without disrupting the latched data, the smaller the timing budget upstream logic has to generate the input data.

That is, generally speaking, it is often necessary to ensure that an input signal to a clocked logic circuit is stable for at least a certain length of time (also referred to as "hold time") relative to the clock edge in order to ensure correct circuit operation. For example, if hold time requirements were not satisfied by the input to a particular gate (that is, if the input began to transition prematurely), the input might fail to be captured by the gate, possibly causing the gate to fail to evaluate correctly. Alternatively, the premature transition may cause the gate to spuriously evaluate (for example, in the case of dynamic logic circuits that, once discharged by a spurious input, cannot restore their state prior to the discharge until a subsequent precharge phase of operation). Such behaviors may cause incorrect circuit operation.

To mitigate failures due to hold time violations, designers may adopt circuit design rules that specify minimum hold times for various signals. However, such hold time requirements may limit the speed of circuit operation, because for a gate that generates a given input signal to another gate, longer hold times for the given input signal usually leave less time for the generating gate to do useful work. Thus, to the extent that flip-flops 200 and 300 exhibit longer hold times due to their structure, this attribute may create timing pressure for upstream logic paths that need to satisfy the longer hold time requirement.

Figure 4:
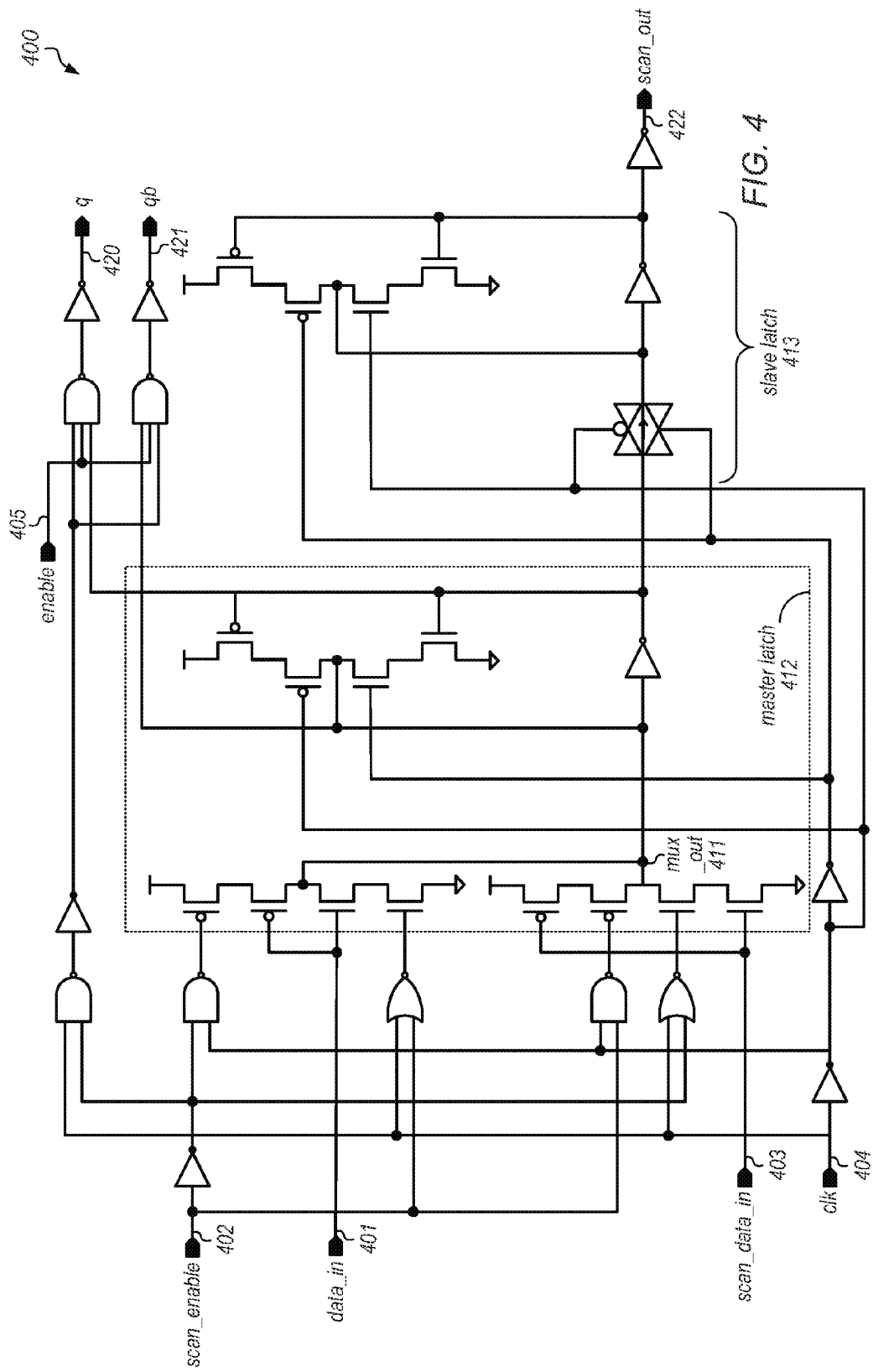
FIG. 4 illustrates an embodiment of a scannable flip-flop having reduced hold time requirements.

FIG. 4 illustrates an example of a scannable flip-flop that may exhibit reduced hold time requirements (for example, relative to the embodiment of FIG. 2), which may improve overall circuit performance. In the illustrated embodiment, flip-flop 400 includes inputs and outputs that are similar to those of flip-flop 200 of FIG. 2. For example, flip-flop 400 includes two input ports: a data input 401 and a scan data input 403, respectively denoted "data_in" and "scan_data_in." Flip-flop 400 also includes a multiplexer select input 402 denoted "scan_enable" and an output enable signal 405 denoted "enable." Flip-flop 400 further includes a clock input 404 denoted "clk." Flip-flop 400 also includes true and complement data outputs 420 and 421 respectively denoted "q" and "qb," as well as a scan data output 422 denoted "scan_out." As with flip-flop 200, the data outputs 420 and 421 may be implemented using an RTZ encoding, whereas the scan data output 422 may be implemented as a static output. (It is noted that RTZ encoding may facilitate the conversion of static signals to dynamic signals, enabling the output of flip-flop 400 to drive dynamic logic circuits while still preserving scan functionality in the embodiments discussed here.) Also as with flip-flop 200, instances of flip-flop 400 may be coupled to form scan chains of arbitrary complexity, for example by daisy-chaining the scan data outputs 422 and scan data inputs 403 of successive flip-flops 400.

Like flip-flop 200, flip-flop 400 includes a master-slave latch combination shown as master latch 412 and slave latch 413. These latches include feedback loop storage elements based on pairs of inverters similar to those of flip-flop 200. However, in flip-flop 400, the multiplexer has been incorporated within master latch 412, instead of preceding the master latch as in flip-flop 200. In the illustrated embodiment, clock 404 is combined and encoded into the multiplexer select signal via the illustrated combinatorial logic circuits shown as NAND and NOR gates. That is, clock 404 is applied at the input to the 2:1 multiplexer, instead of being applied to a gate that follows the multiplexer (e.g., as with the pass gate of master latch 212 shown in FIG. 2). Put another way, in flip-flop 400, each of the multiplexer input ports may be said in a general sense to be qualified or conditionally selected by the multiplexer select signal and the clock signal. (It is noted that within this general sense, different ports may be qualified in different ways, for example by using different logical combinations of the select signal and the clock signal.)

In the illustrated configuration, although the output of master latch 412 couples to the feedback loop storage element of slave latch 413 via a pass gate, it is noted that as a result of incorporating the multiplexer ports within master latch 412, multiplexer output 411 is directly coupled to the feedback loop storage element of master latch 412 with no intervening pass gate. That is, the pass gate shown at the input of master latch 212 of flip-flop 200 is omitted in flip-flop 400 (and in the embodiment shown in FIG. 6 and discussed below). Also, it is noted that in the illustrated configuration, the control inputs to the multiplexer ports can only be asserted (and consequently, the multiplexer can only pass data) during the phase of clock 404 during which master latch 412 is "open" (e.g., when clock 404 is low, though in other embodiments the opposite phase of clock 404 may be employed). That is, as a result of incorporating the multiplexer within master latch 412, it controllably selects one of its several input ports to pass as the multiplexer output dependent not only on the select signal, but also on the clock signal.

Figure 5:
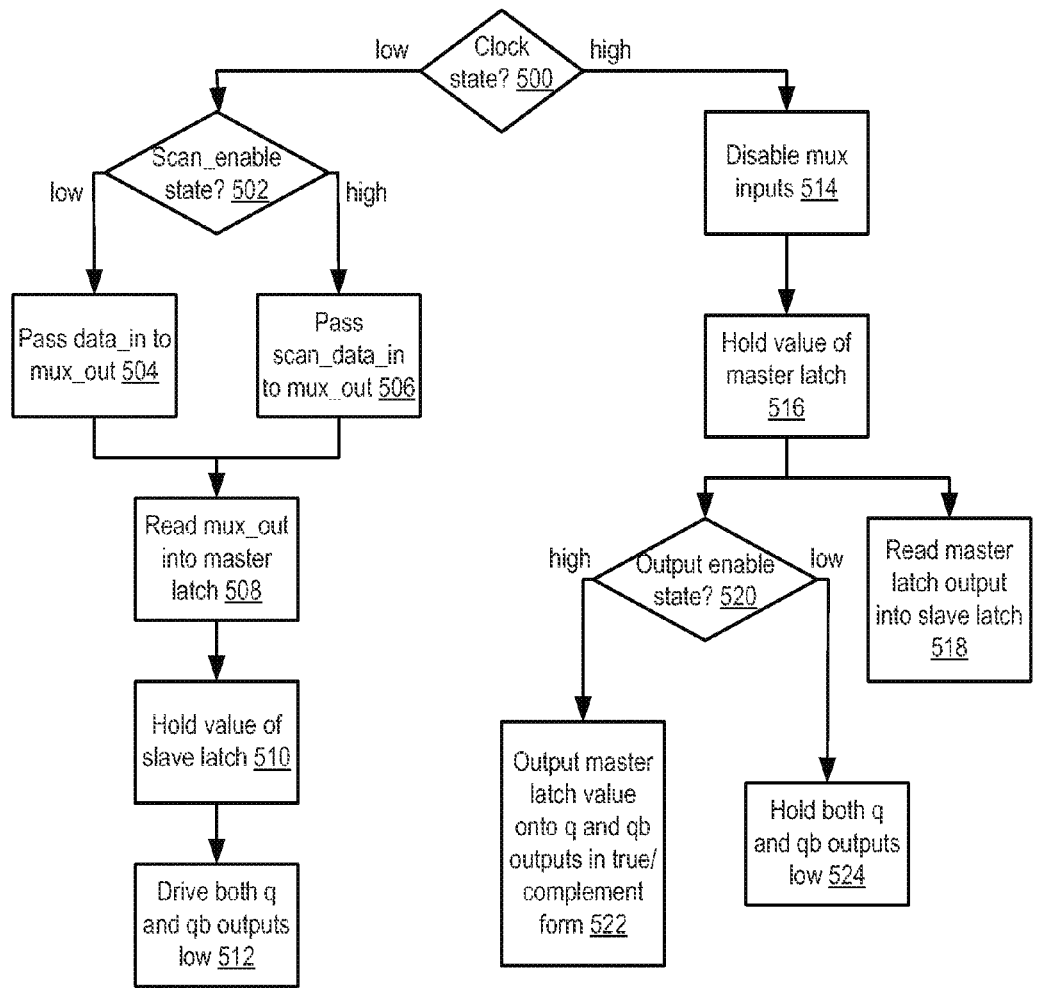
FIG. 5 illustrates a possible method of operation of the embodiment shown in FIG. 4.

FIG. 5 illustrates a possible method of operation of flip-flop 400. It is noted that to facilitate exposition, some operations shown in FIG. 5 are illustrated sequentially. However, during actual circuit operation, some or all of these operations may occur in a different order than shown, or may occur concurrently rather than sequentially. For example, operations performed by different portions of flip-flop 400 may occur concurrently if allowed by the input conditions on which their operations depend.

In the illustrated embodiment, operation depends on the state of input clock 404 (block 500). When clock 404 is low, operation further depends on the state of scan_enable input 402 (block 502). When scan_enable 402 is low, the data_in input of the multiplexer circuit (i.e., the top stack of transistors) will be enabled, and the scan_data_in input of the multiplexer circuit (i.e., the bottom stack of transistors) will be disabled, causing the value of data_in 401 to be passed to mux_out 411 (block 504).

For example, examining the top stack of the multiplexer circuit, the low value of scan_enable 402 along with the low value of clock 404 may cause the NAND gate to output a low value and the NOR gate to output a high value, enabling the respective P and N devices of the stack that are coupled to these gates, and thus enabling the inverter to which data_in 401 is coupled. By contrast, considering the bottom stack of the multiplexer circuit, the low values of scan_enable 402 and clock 404 may cause the NAND gate to output a high value and the NOR gate to output a low value, disabling the respective P and N devices of the bottom stack. (It is noted that in the embodiment of FIG. 4, data_in 401 is coupled to the devices of the top stack that are closest to the output, because these devices typically switch faster than devices that are farther from the output node, and are thus better suited for timing-critical inputs. However, alternative configurations are also possible. For example, the devices of either multiplexer stack may be arranged in any suitable order.)

When scan_enable 402 is high, the data_in input of the multiplexer circuit will be disabled, and the scan_data_in input of the multiplexer circuit will be enabled, causing the value of scan_data_in 403 to be passed to mux_out 411 (block 506). For example, examining the top stack of the multiplexer circuit, the high value of scan_enable 402 along with the low value of clock 404 may cause the NAND gate to output a high value and the NOR gate to output a low value, disabling the respective P and N devices of the stack that are coupled to these gates, and thus disabling the inverter to which data_in 401 is coupled. By contrast, considering the bottom stack of the multiplexer circuit, the high value of scan_enable 402 and the low value of clock 404 may cause the NAND gate to output a low value and the NOR gate to output a high value, enabling the inverter to which scan_data_in 403 is coupled.

The low value of clock 404 further causes the feedback inverter of master latch 412 to be disabled, allowing the multiplexer output 411 to be read into master latch 412 (block 508). The low value of clock 404 may further cause the feedback inverter and the pass gate of slave latch 413 to be respectively enabled and disabled, causing slave latch 413 to hold whatever value had been previously written to it (block 510). Additionally, the low value of clock 404 causes both outputs q 420 and qb 421 to be driven low (block 512).

When clock 404 is in a high state, both inputs of the multiplexer circuit will be disabled (block 514). For example, the high state may cause both NOR gates to output low values, disabling their respective N devices, and likewise may cause both NAND gates to output high values, disabling their respective P devices. Additionally, the high value of clock 404 causes the feedback inverter of master latch 412 to be enabled, allowing the value of multiplexer output 411 that was previously read into master latch 412 to be stored within a feedback loop (block 516). The high value of clock 404 further causes the feedback inverter and the pass gate of slave latch 413 to be respectively disabled and enabled, causing slave latch 413 to "open" and receive the value presented to it at the output of master latch 412 (block 518).

In the illustrated embodiment, when clock 404 is in a high state, the values driven on outputs q 420 and qb 421 depend on the state of enable 405 (block 520). When enable 405 is high, the value stored in master latch 412 is driven onto outputs q 420 and qb 421 in true and complement form (block 522). When enable 405 is low, both of outputs q 420 and qb 421 remain low regardless of the value stored in master latch 412 (block 524). It is noted that in other embodiments, enable 405 may be implemented using a different encoding, or may be omitted entirely.

In functional terms, the operation of the master latch of flip-flop 400 is similar to that of flip-flop 200, in that the master latch may be open when the clock is low and closed when the clock is high. However, flip-flop 400 eliminates the master pass gate found in flip-flop 200 and instead incorporates clocking within the multiplexer itself. Consequently, the input data may be effectively captured at the multiplexer stage of flip-flop 200, instead of at a gate that follows the multiplexer stage. By latching the input data earlier while the clock path timing remains approximately the same, the hold time requirement for the input data may be reduced, potentially improving circuit performance.

Figure 6:
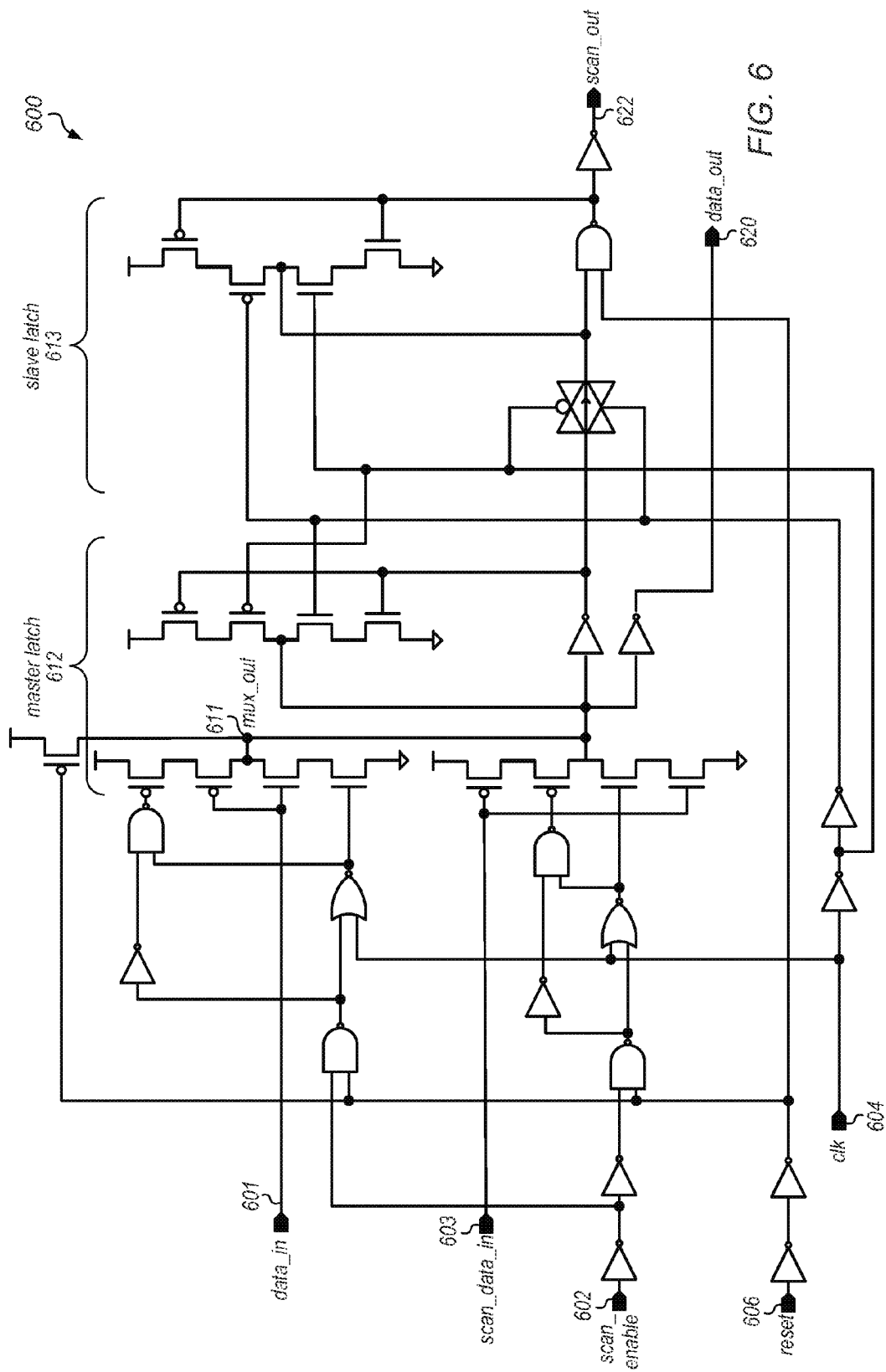
FIG. 6 illustrates an embodiment of a reduced-hold-time scannable flip-flop that provides reset functionality.

FIG. 6 illustrates an embodiment of a resettable flip-flop that may exhibit reduced hold time requirements. In the illustrated embodiment, flip-flop 600 includes inputs and outputs that are similar to those of flip-flop 300 of FIG. 3. For example, flip-flop 600 includes a data input 601 and a scan data input 603, respectively denoted "data_in" and "scan_data_in," as well as a multiplexer select input 602 denoted "scan_enable" and a clock input 604 denote "clk." Flip-flop 600 further includes a reset input 606 denoted "reset" as well as a single-ended data output 620 denoted "data_out" in addition to its scan data output 622 denoted "scan_out." As with flip-flop 300, in the illustrated embodiment, data output 620 is static rather than encoded in RTZ format, although in alternative embodiments, data output 620 of flip-flop 600 could be implemented in an RTZ fashion in a manner similar to that described above with respect to outputs q 220 and qb 221 of flip-flop 200. Also, as mentioned above with respect to flip-flop 400, in various embodiments, the ordering of devices in the multiplexer port stacks of flip-flop 600 may vary from the order shown (e.g., to account for differences in input signal timing).

As with flip-flop 300, flip-flop 600 includes, reset functionality, a multiplexer followed by a master-slave latch combination, and static data output and scan data outputs, and may also be interconnected to form scan chains. Specifically, flip-flop 600 includes a master latch 615 including 2:1 input multiplexer having an output node 611 denoted "mux_out," and also includes a slave latch 613. However, like flip-flop 400 discussed above, in flip-flop 600, as a result of incorporating the multiplexer into the master latch, the clock is combined and encoded into the multiplexer select signal along with the reset signal. That is, like flip-flop 400, both stacks of the multiplexer stage may be disabled when the clock is high. When the clock is low, the operation of the multiplexer depends on the state of the reset and scan_enable inputs in a manner similar to that of flip-flop 300. In other words, flip-flop 600 may be functionally similar to flip-flop 300, but with the reduced hold time characteristics of flip-flop 400.

Figure 7:
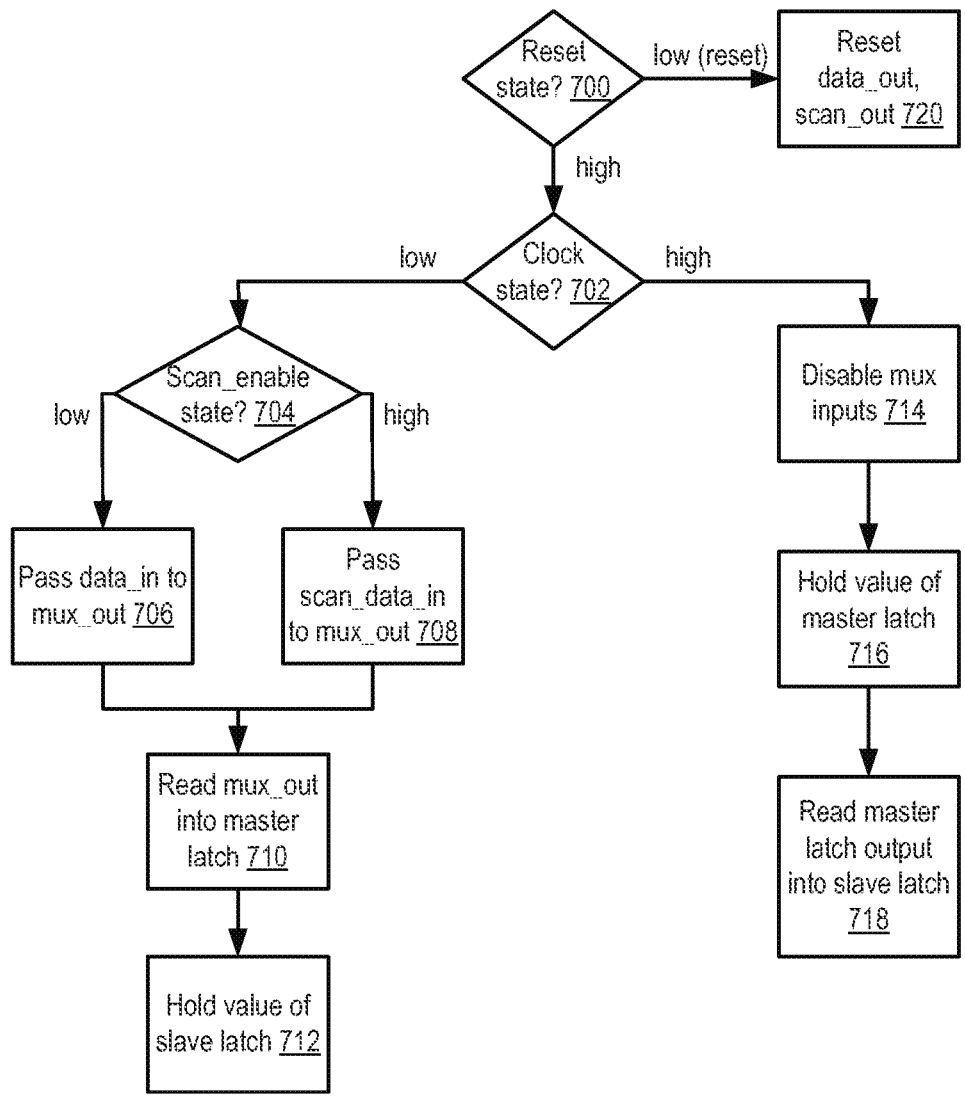
FIG. 7 illustrates a possible method of operation of the embodiment shown in FIG. 6.

FIG. 7 illustrates a possible method of operation of flip-flop 600. It is noted that to facilitate exposition, some operations shown in FIG. 7 are illustrated sequentially. However, as noted with respect to FIG. 5, during actual circuit operation, some or all of these operations may occur in a different order than shown, or may occur concurrently rather than sequentially. For example, operations performed by different portions of flip-flop 600 may occur concurrently if allowed by the input conditions on which their operations depend.

In the illustrated embodiment, operation depends on the state of reset input 606 (block 700). When reset 606 is high, flip-flop 600 is in a normal operating mode, and operation further depends on the state of input clock 604 (block 702). When clock 604 is low, operation further depends on the state of scan_enable input 602 (block 704). When scan_enable 602 is low, the data_in input of the multiplexer circuit (i.e., the top stack of transistors) will be enabled, and the scan_data_in input of the multiplexer circuit (i.e., the bottom stack of transistors) will be disabled, causing the value of data_in 601 to be passed to mux_out 611 (block 706).

For example, examining the top stack of the multiplexer circuit, the illustrated NAND and NOR gates may combine the tow value of scan_enable 602 along with the low value of clock 604 and the high value of reset 606 to enable the respective P and N devices that control the inverter that is coupled to data_in 601, causing the value of data_in 601 to be passed. By contrast, considering the bottom stack of the multiplexer circuit, the same configuration of inputs may be combined by the illustrated NAND and NOR gates to disable the respective P and N devices that control the inverter coupled to scan_data_in 603.

When scan_enable 602 is high, the data_in input of the multiplexer circuit will be disabled, and the scan_data_in input of the multiplexer circuit will be enabled, causing the value of scan_data_in 603 to be passed to mux_out 611 (block 708). For example, the illustrated NAND and NOR gates may combine the state of the inputs to enable the P and N devices that control the inverter coupled to scan_data_in 603 and disable the P and N devices that control the inverter coupled to data_in 601.

The low value of clock 604 further causes the feedback inverter of master latch 612 to be disabled, allowing the multiplexer output 611 to be read into master latch 612 (block 710). (It is noted that in contrast to flip-flop 400, which implemented a dual-rail RTZ-encoded output, flip-flop 600 implements a static data_out 620 that simply tracks the inverse of the value of mux_out 611 at any given time, although other output configurations of flip-flop 600 are possible and contemplated.)

The low value of clock 604 may further cause the feedback inverter and the pass gate of slave latch 613 to be respectively enabled and disabled, causing slave latch 613 to hold whatever value had been previously written to it (block 712).

When clock 604 is in a high state, both inputs of the multiplexer circuit will be disabled (block 714). For example, the high state may cause both NOR gates that are coupled to clock 604 to output low values, disabling their respective N devices, and likewise may cause both NAND gates that are coupled to the NOR gates to output high values, disabling their respective P devices. Additionally, the high value of clock 604 causes the feedback inverter of master latch 612 to be enabled, allowing the value of multiplexer output 611 that was previously read into master latch 412 to be stored within a feedback loop (block 716). The high value of clock 604 further causes the feedback inverter and the pass gate of stave latch 613 to be respectively disabled and enabled, causing slave latch 613 to "open" and receive the value presented to it at the output of master latch 612 (block 718).

When reset 606 is in a low state, flip-flop 600 is in a reset mode, and both data_out 620 and scan_out 622 may be driven to a low state regardless of the state of other inputs to flip-flop 600 (block 720). For example, the low state on reset 606 may activate the pullup P-type device coupled to mux_out 611, causing this node to be driven high, and correspondingly causing data_out 620 to be driven low. Separately, the low state on reset 606 may force scan_put 622 to be driven tow via the NAND gate driving this output. Although reset 606 is described here as being an active-low signal, in other embodiments, a high state rather than a low state on reset 606 may cause flip-flop 600 to reset.

It is noted that although the multiplexing functionality of the scannable flip-flops described herein has been discussed in the specific context of selecting between scan-mode data and functional-mode data, it is contemplated that the multiplexing feature may be used in connection with any suitable application. That is, it is not necessary that one of the data inputs correspond to scan data. Rather, in other embodiments, the data inputs may correspond to any suitable data sources, including functional-mode data sources. Also, in various embodiments, more than two inputs may be multiplexed. For example, embodiments of the flip-flops discussed above may provide for three, four, or any suitable number of inputs from which the data to be stored may be selected.

Further variations on the embodiments discussed above are possible and contemplated. For example, in some embodiments, the pass gate shown in slave latches 413 and/or 613 may be replaced by a controllable inverter (e.g., a clocked or tristate inverter like the feedback inverter shown in latches 413 and 613) to form a tristate latch rather than a pass-gate latch. Similarly, in some embodiments, pass gates may be employed instead of illustrated controllable inverters. Also, in some embodiments, the slave latch output may be used as a functional mode data output instead of or in addition to a scan data output. For example, both the master and slave latch outputs may be used during functional mode operation to output the same flip-flop data with different timing.

Although flip-flops 400 and 600 may be used within logic paths as shown in FIG. 1, they may also be used in any suitable storage application. For example, flip-flops 400 or 600 may be arranged to implement a memory-type structure, such as a register, a register file, a butler, a first-in-first-out (FIFO) queue, a last-in-first-out (LIFO) queue, a cache, or any other suitable type of arrangement.

Processor Overview

Figure 8:
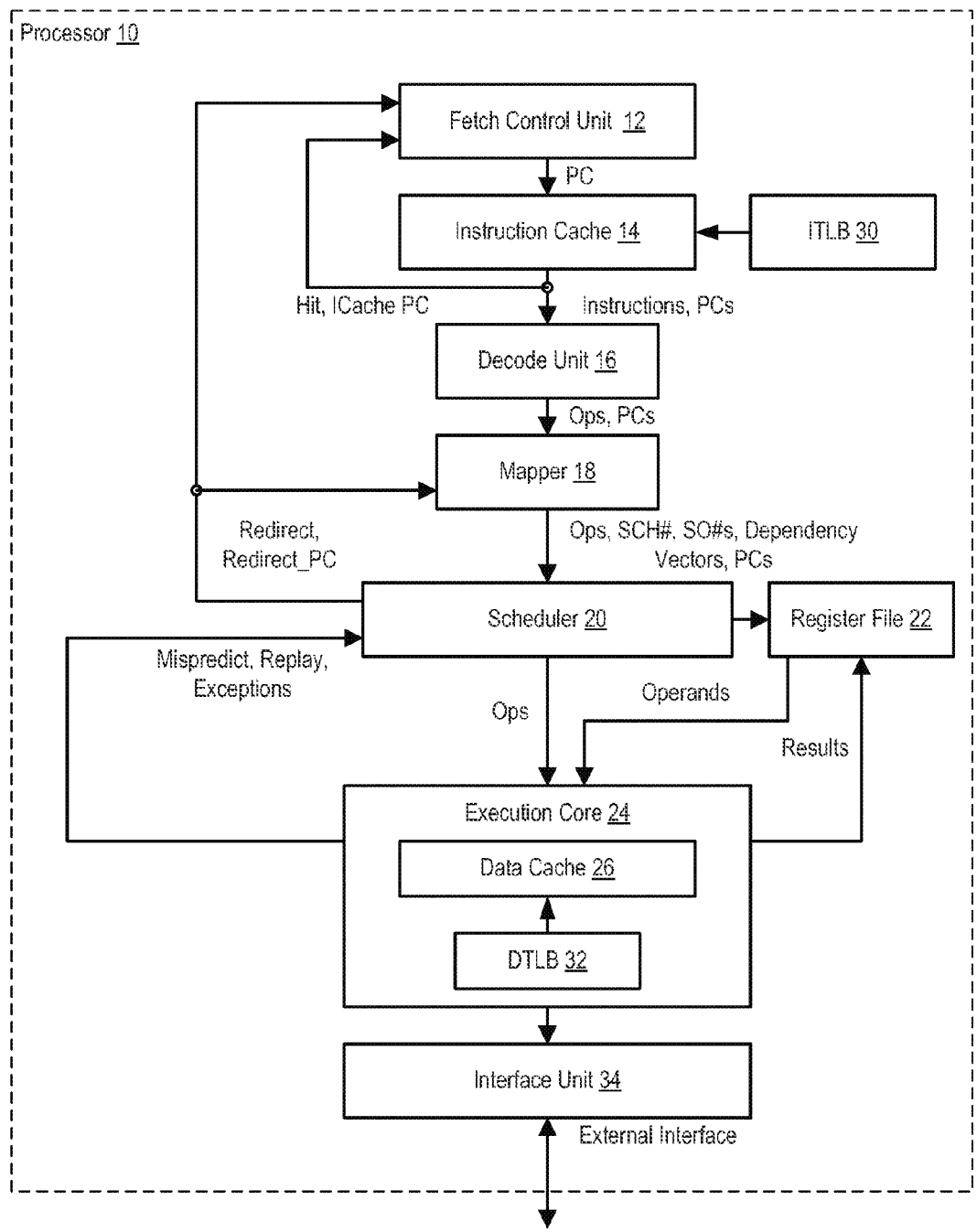
FIG. 8 illustrates an embodiment of a processor that may include one or more scannable flip-flops.

Turning now to FIG. 8, a block diagram of an embodiment of a processor 10 is shown. Processor 10 may include one or more flip-flops that incorporate some or all of the features described above with respect to flip-flops 400 and 500. In the illustrated embodiment, the processor 10 includes a fetch control unit 12, an instruction cache 14, a decode unit 16, a mapper 18, a scheduler 20, a register file 22, an execution core 24, and an interface unit 34. The fetch control unit 12 is coupled to provide a program counter address (PC) for fetching from the instruction cache 14. The instruction cache 14 is coupled to provide instructions (with PCs) to the decode unit 16, which is coupled to provide decoded instruction operations (ops, again with PCs) to the mapper 18. The instruction cache 14 is further configured to provide a hit indication and an ICache PC to the fetch control unit 12. The mapper 18 is coupled to provide ops, a scheduler number (SCH#), source operand numbers (SO#s), one or more dependency vectors, and PCs to the scheduler 20. The scheduler 20 is coupled to receive replay, mispredict, and exception indications from the execution core 24, is coupled to provide a redirect indication and redirect PC to the fetch control unit 12 and the mapper 18, is coupled to the register file 22, and is coupled to provide ops for execution to the execution core 24. The register file is coupled to provide operands to the execution core 24, and is coupled to receive results to be written to the register file 22 from the execution core 24. The execution core 24 is coupled to the interface unit 34, which is further coupled to an external interface of the processor 10.

Fetch control unit 12 may be configured to generate fetch PCs for instruction cache 14. In some embodiments, fetch control unit 12 may include one or more types of branch predictors. For example, fetch control unit 12 may include indirect branch target predictors configured to predict the target address for indirect branch instructions, conditional branch predictors configured to predict the outcome of conditional branches, and/or any other suitable type of branch predictor. During operation, fetch control unit 12 may generate a fetch PC based on the output of a selected branch predictor. If the prediction later turns out to be incorrect, fetch control unit 12 may be redirected to fetch from a different address. When generating a fetch PC, in the absence of a nonsequential branch target (i.e., a branch or other redirection to a nonsequential address, whether speculative or nonspeculative), fetch control unit 12 may generate a fetch PC as a sequential function of a current PC value. For example, depending on how many bytes are fetched from instruction cache 14 at a given time, fetch control unit 12 may generate a sequential fetch PC by adding a known offset to a current PC value.

The instruction cache 14 may be a cache memory for storing instructions to be executed by the processor 10. The instruction cache 14 may have any capacity and construction (e.g. direct mapped, set associative, fully associative, etc.). The instruction cache 14 may have any cache line size. For example, 64 byte cache lines may be implemented in an embodiment. Other embodiments may use larger or smaller cache line sizes. In response to a given PC from the fetch control unit 12, the instruction cache 14 may output up to a maximum number of instructions. It is contemplated that processor 10 may implement any suitable instruction set architecture (ISA), such as, e.g., the ARM™, PowerPC™, or x86 ISAs, or combinations thereof.

In some embodiments, processor 10 may implement an address translation scheme in which one or more virtual address spaces are made visible to executing software. Memory accesses within the virtual address space are translated to a physical address space corresponding to the actual physical memory available to the system, for example using a set of page tables, segments, or other virtual memory translation schemes. In embodiments that employ address translation, the instruction cache 14 may be partially or completely addressed using physical address bits rather than virtual address bits. For example, instruction cache 14 may use virtual address bits for cache indexing and physical address bits for cache tags.

In order to avoid the cost of performing a full memory translation when performing a cache access, processor 10 may store a set of recent and/or frequently-used virtual-to-physical address translations in a translation lookaside buffer (TLB), such as Instruction TLB (ITLB) 30. During operation, ITLB 30 (which may be implemented as a cache, as a content addressable memory (CAM), or using any other suitable circuit structure) may receive virtual address information and determine whether a valid translation is present. If so, ITLB 30 may provide the corresponding physical address bits to instruction cache 14. If not, ITLB 30 may cause the translation to be determined, for example by raising a virtual memory exception.

The decode unit 16 may generally be configured to decode the instructions into instruction operations (ops). Generally, an instruction operation may be an operation that the hardware included in the execution core 24 is capable of executing. Each instruction may translate to one or more instruction operations which, when executed, result in the operation(s) defined for that instruction being performed according to the instruction set architecture implemented by the processor 10. In some embodiments, each instruction may decode into a single instruction operation. The decode unit 16 may be configured to identify the type of instruction, source operands, etc., and the decoded instruction operation may include the instruction along with some of the decode information. In other embodiments in which each instruction translates to a single op, each op may simply be the corresponding instruction or a portion thereof (e.g. the opcode field or fields of the instruction). In some embodiments in which there is a one-to-one correspondence between instructions and ops, the decode unit 16 and mapper 18 may be combined and/or the decode and mapping operations may occur in one clock cycle. In other embodiments, some instructions may decode into multiple instruction operations. In some embodiments, the decode unit 16 may include any combination of circuitry and/or microcoding in order to generate ops for instructions. For example, relatively simple op generations (e.g. one or two ops per instruction) may be handled in hardware while more extensive op generations (e.g. more than three ops for an instruction) may be handled in microcode.

Ops generated by the decode unit 16 may be provided to the mapper 18. The mapper 18 may implement register renaming to map source register addresses from the ops to the source operand numbers (SO#s) identifying the renamed source registers. Additionally, the mapper 18 may be configured to assign a scheduler entry to store each op, identified by the SCH#. In an embodiment, the SCH# may also be configured to identify the rename register assigned to the destination of the op. In other embodiments, the mapper 18 may be configured to assign a separate destination register number. Additionally, the mapper 18 may be configured to generate dependency vectors for the op. The dependency vectors may identify the ops on which a given op is dependent. In an embodiment, dependencies are indicated by the SCH# of the corresponding ops, and the dependency vector bit positions may correspond to SCH#s. In other embodiments, dependencies may be recorded based on register numbers and the dependency vector bit positions may correspond to the register numbers.

The mapper 18 may provide the ops, along with SCH#, SO#s, PCs, and dependency vectors for each op to the scheduler 20. The scheduler 20 may be configured to store the ops in the scheduler entries identified by the respective SCH#s, along with the SO#s and PCs. The scheduler may be configured to store the dependency vectors in dependency arrays that evaluate which ops are eligible for scheduling. The scheduler 20 may be configured to schedule the ops for execution in the execution core 24. When an op is scheduled, the scheduler 20 may be configured to read its source operands from the register file 22 and the source operands may be provided to the execution core 24. The execution core 24 may be configured to return the results of ops that update registers to the register file 22. In some cases, the execution core 24 may forward a result that is to be written to the register file 22 in place of the value read from the register file 22 (e.g. in the case of back to back scheduling of dependent ops).

The execution core 24 may also be configured to detect various events during execution of ops that may be reported to the scheduler. Branch ops may be mispredicted, and some load/store ops may be replayed (e.g. for address-based conflicts of data being written/read). Various exceptions may be detected (e.g. protection exceptions for memory accesses or for privileged instructions being executed in non-privileged mode, exceptions for no address translation, etc.). The exceptions may cause a corresponding exception handling routine to be executed.

The execution core 24 may be configured to execute predicted branch ops, and may receive the predicted target address that was originally provided to the fetch control unit 12. The execution core 24 may be configured to calculate the target address from the operands of the branch op, and to compare the calculated target address to the predicted target address to detect correct prediction or misprediction. The execution core 24 may also evaluate any other prediction made with respect to the branch op, such as a prediction of the branch op's direction. If a misprediction is detected, execution core 24 may signal that fetch control unit 12 should be redirected to the correct fetch target. Other units, such as the scheduler 20, the mapper 18, and the decode unit 16 may flush pending ops/instructions from the speculative instruction stream that are subsequent to or dependent upon the mispredicted branch.

The execution core may include a data cache 26, which may be a cache memory for storing data to be processed by the processor 10. Like the instruction cache 14, the data cache 26 may have any suitable capacity, construction, or line size (e.g. direct mapped, set associative, fully associative, etc.). Moreover, the data cache 26 may differ from the instruction cache 14 in any of these details. As with instruction cache 14, in some embodiments, data cache 26 may be partially or entirely addressed using physical address bits. Correspondingly, a data TLB (DTLB) 32 may be provided to cache virtual-to-physical address translations for use in accessing the data cache 26 in a manner similar to that described above with respect to ITLB 30. It is noted that although ITLB 30 and DTLB 32 may perform similar functions, in various embodiments they may be implemented differently. For example, they may store different numbers of translations and/or different translation information.

The register file 22 may generally include any set of registers usable to store operands and results of ops executed in the processor 10. In some embodiments, the register file 22 may include a set of physical registers and the mapper 18 may be configured to map the logical registers to the physical registers. The logical registers may include both architected registers specified by the instruction set architecture implemented by the processor 10 and temporary registers that may be used as destinations of ops for temporary results (and sources of subsequent ops as well). In other embodiments, the register file 22 may include an architected register set containing the committed state of the logical registers and a speculative register set containing speculative register state.

The interface unit 24 may generally include the circuitry for interfacing the processor 10 to other devices on the external interface. The external interface may include any type of interconnect (e.g. bus, packet, etc.). The external interface may be an on-chip interconnect, if the processor 10 is integrated with one or more other components (e.g. a system on a chip configuration). The external interface may be on off-chip interconnect to external circuitry, if the processor 10 is not integrated with other components. In various embodiments, the processor 10 may implement an instruction set architecture.

System and Computer Accessible Storage Medium

Figure 9:
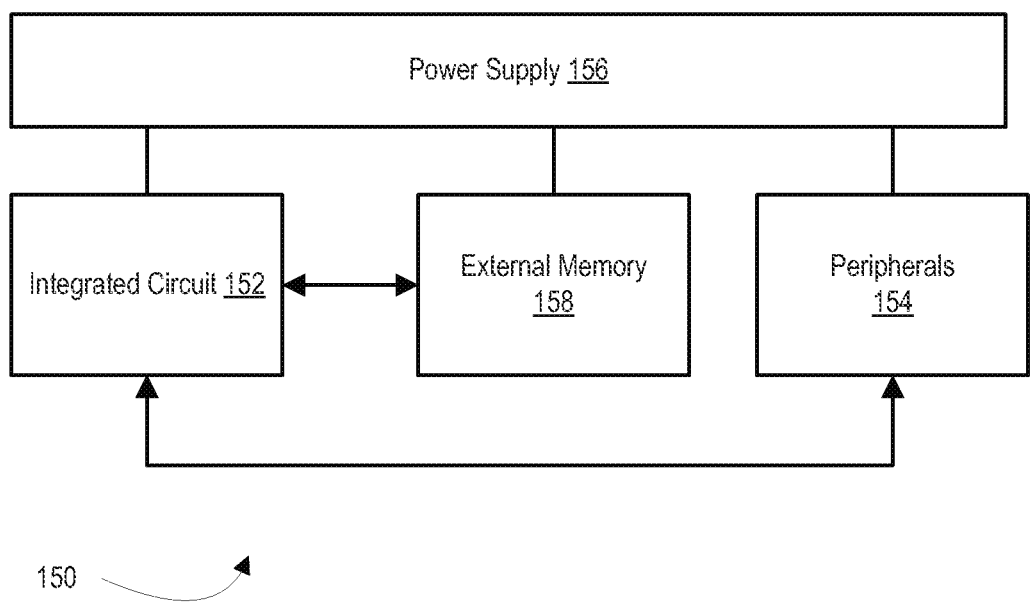
FIG. 9 illustrates an embodiment of a system that may include a processor.

Turning next to FIG. 9, a block diagram of an embodiment of a system 150 is shown. In the illustrated embodiment, the system 150 includes at least one instance of an integrated circuit 152. The integrated circuit 152 may include one or more instances of the processor 10 (from FIG. 8). The integrated circuit 152 may, in an embodiment, be a system on a chip including one or more instances of the processor 10 and various other circuitry such as a memory controller, video and/or audio processing circuitry, on-chip peripherals and/or peripheral interfaces to couple to off-chip peripherals, etc. The integrated circuit 152 is coupled to one or more peripherals 154 and an external memory 158. A power supply 156 is also provided which supplies the supply voltages to the integrated circuit 152 as well as one or more supply voltages to the memory 158 and/or the peripherals 154. In some embodiments, more than one instance of the integrated circuit 152 may be included (and more than one external memory 158 may be included as well).

The peripherals 154 may include any desired circuitry, depending on the type of system 150. For example, in an embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may include SRAM, nonvolatile RAM (NVRAM, such as "flash" memory), and/or dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a master latch including a multiplexer and a master feedback loop;
      wherein the multiplexer includes multiple input ports, wherein each input port comprises a respective one of a plurality of inverters, wherein each given one of the inverters includes a data input and a control input coupled such that in response to assertion of the control input, the given inverter outputs an inverse of the data input, and wherein the outputs of the inverters are coupled to form a multiplexer output; and
      wherein the master feedback loop includes a master inverter and a master feedback inverter, wherein the master feedback inverter includes a data input coupled to the master inverter and a control input coupled to a clock signal, wherein during a first phase of the clock signal, the master feedback inverter is disabled, and wherein during a second phase of the clock signal, the master feedback inverter is enabled and the master feedback loop stores a value received from the multiplexer output;
   a slave latch comprising a pass gate and a slave feedback loop including a slave inverter and a slave feedback inverter, wherein the slave feedback inverter includes a data input coupled to the slave inverter and a control input coupled to the clock signal, wherein during the second phase of the clock signal, the pass gate is enabled and the slave feedback inverter is disabled, and wherein during the first phase of the clock signal, the pass gate is disabled, the slave feedback inverter is enabled, and the slave feedback loop stores a value received from the master latch via the pass gate; and
   a plurality of combinatorial logic circuits coupled to generate the respective control inputs of the plurality of inverters of the multiplexer dependent upon the clock signal and a select signal, such that for each given inverter, assertion of the control input occurs only during the first phase of the clock signal;
   wherein the plurality of combinatorial logic circuits is further coupled to generate the respective control inputs of the plurality of inverters of the multiplexer dependent on a reset signal, wherein during assertion of the reset signal, all control inputs of the plurality of inverters are deasserted and outputs of the master latch and slave latch are reset.

2. The apparatus of claim 1, wherein one of the input ports of the multiplexer is coupled to receive scan data, wherein an output of the slave latch is coupled to drive a scan data output, and wherein the select signal is indicative of a scan mode of operation, such that during the first phase of the clock signal, assertion of the select signal causes the multiplexer to select the scan data.

3. The apparatus of claim 1, further comprising a data output circuit coupled to the master latch, wherein the data output circuit is coupled to output a value stored in the master latch in a true-and-complement, return-to-zero (RTZ) format such that the data output circuit drives a valid data value during the second phase of the clock signal.

4. An apparatus, comprising:
   a master latch that includes a multiplexer, wherein the multiplexer includes multiple ports, each coupled to receive respective input data, wherein the multiplexer controllably selects one of the multiple ports to generate a multiplexer output dependent upon a select signal and a clock signal, and wherein the master latch controllably stores a value of the multiplexer output; and
   a slave latch coupled to receive an output from the master latch;
   wherein the master latch and the slave latch are controllable by the clock signal to implement a master-slave flip-flop;
   wherein to controllably select one of the multiple ports, the multiplexer is coupled to qualify each of the multiple ports with the select signal and the clock signal prior to generating the multiplexer output;
   wherein the master latch is coupled to drive a data output of the master-slave flip-flop, wherein the data output is encoded in return-to-zero (RTZ) format.

5. The apparatus of claim 4, wherein the output from the master latch couples to a slave storage element of the slave latch via a pass gate, and wherein the multiplexer output couples directly to a master storage element of the master latch with no intervening pass gate.

6. The apparatus of claim 5, wherein the master storage element comprises a master feedback loop and the slave storage element comprises a slave feedback loop, wherein the master feedback loop and the slave feedback loop are respectively enabled by opposite phases of the clock signal.

7. The apparatus of claim 4, wherein the select signal is a scan enable signal indicative of a scan mode of operation, wherein one of the ports is coupled to receive scan data during the scan mode of operation, and wherein the slave latch is coupled to drive a scan data output of the master-slave flip-flop.

8. The apparatus of claim 7, wherein the scan data output is a static signal.

9. The apparatus of claim 4, wherein the multiplexer is further coupled to qualify each of the multiple ports with a reset signal, wherein during assertion of the reset signal, outputs of the master latch and slave latch are reset.

10. The apparatus of claim 4, wherein to controllably select one of the multiple ports, the multiplexer is further coupled to qualify each of the multiple ports with a reset signal prior to generating the multiplexer output, such that during assertion of the reset signal, all ports of the multiplexer are deasserted irrespective of states of the clock signal or the select signal.

11. The apparatus of claim 10, wherein the reset signal is further coupled to reset the master latch and the slave latch during assertion of the reset signal.

12. The apparatus of claim 11, wherein the reset signal is asserted when driven to a low logic state.

13. A method, comprising:
   receiving input data at a multiplexer included within a master latch of a flip-flop;
   prior to generating an output of the multiplexer, qualifying the input data with a select signal and a clock signal;
   during a first phase of the clock signal, reading the output of the multiplexer into a storage element of the master latch;
   during a second phase of the clock signal, reading an output of the master latch into a slave latch of the flip-flop; and
   driving a data output of the flip-flop, wherein the data output is encoded in return-to-zero (RTZ) format.

14. The method of claim 13, further comprising:
   during the first phase of the clock signal, outputting a logic low value as a data output of the flip-flop;
   during the second phase of the clock signal, outputting a value stored in the master latch in true-and-complement form as the data output of the flip-flop.

15. The method of claim 13, further comprising:
   prior to generating the output of the multiplexer, qualifying the input data with a reset signal such that in response to assertion of the reset signal, inputs of the multiplexer are disabled.

16. The method of claim 15, further comprising:
   resetting a data output of the flip-flop and a scan data output of the flip-flop in response to assertion of the reset signal.

17. An apparatus, comprising:
   a plurality of combinatorial logic gates; and
   a plurality of scannable flip-flops;
   wherein the combinatorial logic gates and scannable flip-flops are interconnected to form a plurality of scannable logic paths;
   wherein the scannable flip-flops are interconnected to form a plurality of scan chains;
   wherein each of the scannable flip-flops comprises:
      a master latch including an input stage and a storage element, wherein the input stage is coupled to receive input data; and
      a slave latch coupled to receive an output from the master latch;
   wherein the master latch and the slave latch are controllable by a clock signal to implement a master-slave flip-flop;
   wherein the master latch is coupled to drive a data output of the master-slave flip-flop, wherein the data output is encoded in return-to-zero (RTZ) format; and
   wherein the input stage is coupled to qualify the input data with the clock signal prior to the storage element receiving the input data.

18. The apparatus of claim 17, wherein the input stage comprises a multiplexer including multiple ports, wherein the multiplexer controllably selects one of the multiple ports dependent upon a select signal.

19. The apparatus of claim 17, wherein for each of the scannable flip-flops, the output from the master latch couples to a slave storage element of the slave latch via a pass gate, and wherein the input stage couples directly to the storage element of the master latch with no intervening pass gate.

* * * * *